United States Patent [19]
Diaz et al.

[11] Patent Number: 5,450,267
[45] Date of Patent: Sep. 12, 1995

[54] ESD/EOS PROTECTION CIRCUITS FOR INTEGRATED CIRCUITS

[75] Inventors: Carlos H. Diaz, Urbana, Ill.; Charvaka Duvvury, Plano, Tex.; Sung-Mo Kang, Champaign, Ill.

[73] Assignee: Texas Instruments Incorporated, Dallas, Tex.

[21] Appl. No.: 40,949

[22] Filed: Mar. 31, 1993

[51] Int. Cl.⁶ .................................. H02H 3/24
[52] U.S. Cl. ........................ 361/56; 361/91; 361/118
[58] Field of Search ............ 361/91, 58, 56, 86, 361/111, 118

[56] References Cited

U.S. PATENT DOCUMENTS

5,077,591 12/1991 Chen et al. ................... 361/91
5,086,365 2/1992 Lien ............................. 361/56

*Primary Examiner*—Marc S. Hoff
*Assistant Examiner*—S. Jackson
*Attorney, Agent, or Firm*—Jacqueline J. Garner; Richard L. Donaldson; William E. Hiller

[57] ABSTRACT

An ESD/EOS protection circuit 10. Trigger nMOS transistor M1 has a drain 20 connected to a voltage pad 22, a gate 24 connected to ground 26 and a source 28 connected to ground 26 through source resistor $R_e$. Switch control nMOS transistor M2 has a drain 30, a gate 34 connected to source 28 of transistor M1, and a source 38 connected to ground 26. Current controlled switch (CCS) 40 is connected to voltage pad 22, ground 26 and drain 30 of transistor M2. CCS 40 is a bipolar pnp-based current controlled switch.

27 Claims, 6 Drawing Sheets

ESD/EOS PROTECTION CIRCUITS FOR INTEGRATED CIRCUITS

FIELD OF THE INVENTION

This invention generally relates to ESD/EOS protection circuits.

BACKGROUND OF THE INVENTION

Electrostatic discharge (ESD) and electrical overstress (EOS) are two of the most dominant reliability concerns in the semiconductor industry. The failure susceptibility of integrated circuits (ICs) to ESD and EOS increases as the IC technology progresses towards submicron feature lengths. In spite of the fact that EOS embodies a broad category of electrical threats to semiconductor devices, it is generally accepted that EOS stress sources cause device failure as a result of device self-heating and furthermore, that these sources can be modeled as current sources. This being the case, EOS/EOS immunity of integrated circuits may be qualified in terms of the stress power and/or the stress current required to induce device failure in a specified time.

ESD protection for input, output and/or power supply pins in advanced CMOS ICs is achieved by a protection network that shunts the protected pin and the ground bus under stress events. For input pins, a dedicated protection network that is completely passive under normal operating conditions is added to the input's functional circuitry. For output pins, protection against ESD and EOS is attained with a dedicated protection network whose failure thresholds can in some cases be enhanced by the self-protection capability of the output buffer transistors.

The most common protection schemes used in MOS ICs rely on the parasitic bipolar transistor associated with a nMOS device whose drain is connected to the pin to be protected and whose source tied to ground. The protection level or failure threshold can be set by varying the nMOS device width. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism found in the nMOS protection device operating in snapback conditions is the onset of second breakdown. Second breakdown is a phenomena that induces thermal runaway in the device wherever the reduction of the impact ionization current is offset by the thermal generation of carriers. Second breakdown is initiated in a device under stress as a result of the self-heating. The peak nMOS device temperature at which second breakdown is initiated is known to increase with the stress current level. The time required for the structure to heat-up to this critical temperature is dependent on the device layout and stress power distribution across the device. Furthermore, the peak temperature is proportional to the power density. In nMOS protection transistors, power dissipation is confined to a volume given by $$\Delta = W \cdot X_j \cdot W_{D\_dep}$$

where W is the device width, Xj is the drain junction depth, and $W_{D\_dep}(\approx 0.1 \mu m)$ is the width of the drain depletion region near the gate edge. According to this expression for $\Delta$, the power density is reduced through design by increasing the nMOS device width W.

SUMMARY OF THE INVENTION

Generally, and in one form of the invention, a protection circuit for protecting a device from ESD and EOS is disclosed. A trigger device is connected between a voltage pad and a first resistor. A pnp-based current controlled switch is connected between the voltage pad and ground and a switch driver device is connected between the pnp-based current controlled switch and ground. The switch driver device has a gate connected to the trigger device.

In one embodiment of the invention, the trigger device and the switch driver device comprises nMOS transistors. The trigger nMOS transistor has a gate connected to a ground, a drain connected to the voltage pad and a source connected to a first resistor. The switch driver nMOS transistor has a gate connected to the source of the trigger device, a drain connected to the pnp-based current controlled switch, and a source connected to ground. The pnp-based current controlled switch comprises a first bipolar transistor connected between the voltage pad and ground, a second resistor connected between the voltage pad and the base of the first bipolar transistor, a second bipolar transistor connected between the second resistor and ground, and a third resistor connected between the voltage pad and the switch driver device. The base of the second bipolar transistor is connected to the switch driver device and both the first and second bipolar transistors include parasitic collector resistances.

An advantage of the invention is providing an ESD/EOS protection circuit having reduced stress power density.

A further advantage of the invention is providing an improved ESD/EOS protection circuit capable of handling higher stress currents while utilizing minimal area.

A further advantage of the invention is providing an improved ESD/EOS protection circuit that is less susceptible to second breakdown.

These and other advantages will be apparent to those of ordinary skill in the art having reference to the following specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiments of the invention will be described in connection with an IC fabricated in a n-well CMOS process. It will be apparent to those skilled in the art that the invention is applicable to both BiC-MOS and CMOS processes.

Figure 1:
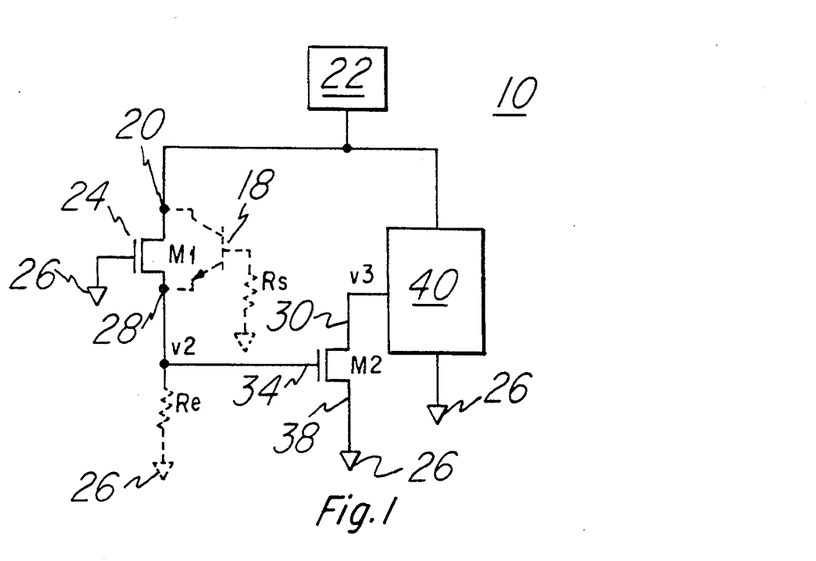
FIG. 1 is a schematic diagram of a first preferred embodiment of the invention.

The ESD/EOS protection circuit 10 according to the first preferred embodiment of the invention is shown in FIG. 1. Trigger device, NMOS transistor M1, has a drain 20 connected to a voltage pad 22, a gate 24 connected to ground 26 and a source 28 connected to ground 26 through source resistor $R_e$. Implicit in transistor M1 is a parasitic bipolar transistor 18 and resistor $R_s$. Switch driver device, NMOS transistor M2, has a drain 30, a gate 34 connected to source 28 of transistor M1 at voltage node V2, and a source 38 connected to ground 26. Current controlled switch (CCS) 40 is connected to voltage pad 22, ground 26 and, at voltage node V3, drain 30 of transistor M2. CCS 40 is a bipolar pnp-based switch.

Transistor M1 operates in the snapback region under stress conditions. It determines the trigger point of the circuit 10 (ESD/EOS event detector) and the initial value of the clamp voltage. The amount of stress current that M1 could be expected to draw is determined by the source resistance $R_e$, the size of M2, and the dynamic on-resistance of CCS 40. Increasing $R_e$ and the size of M2 could reduce the current through M1 (used to trigger CCS 40) and therefore its power dissipation level. The driver nMOS transistor M2 will begin conducting once its gate voltage, determined by the voltage drop across $R_e$, goes above the threshold voltage. Once M2 goes into conduction, the pnp-based CCS 40 can shunt voltage pad 22 and ground 26 carrying most of the stress current. M2 may actually drain a fraction of the stress current (i.e., the CCS 40 driving current). The amount of stress current drained by M2 is mainly determined by the stress current level and the value of the forward gain of the pnp device (CCS 40). Power dissipation in M2 is generally larger than in M1 but through design can be made much lower than the total power delivered by the stress source to the protection circuit 10. Under these conditions, most of the stress power dissipation can, by design, be diverted into the pnp-based CCS 40. CCS 40 has an active volume much larger than the one for an nMOS protection transistor of comparable size in a traditional protection scheme. Thus, ESD/EOS protection circuit 10 will have low overall power density resulting in reduced self-heating and increased failure thresholds.

Figure 2:
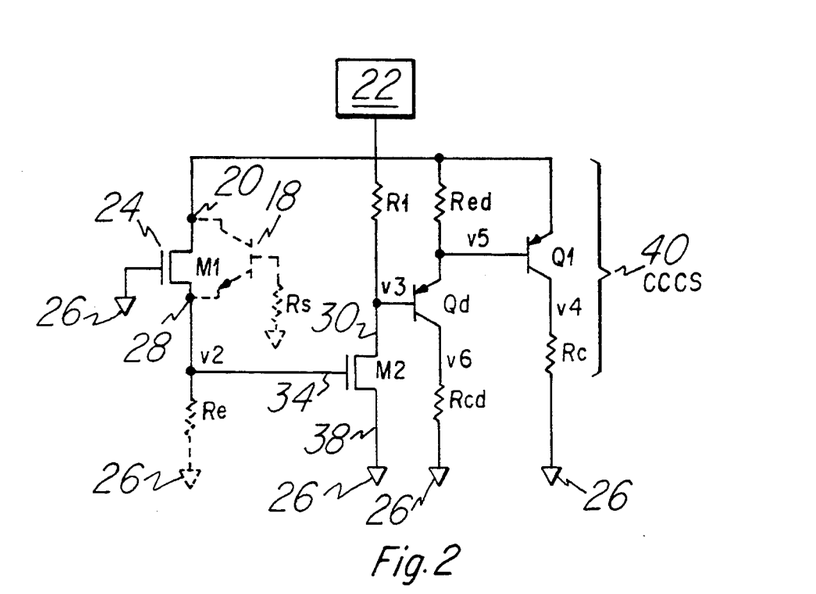
FIG. 2 is a detailed schematic diagram of a first preferred embodiment of the invention.

Referring to FIG. 2, in the preferred embodiment, CCS 40 contains a pair of pnp devices Q1 and Qd connected as a Darlington pair. A first resistor $R_1$ is connected between voltage pad 22 and drain 30 of transistor M2. Bipolar transistor Q1 connected between voltage pad 22 and ground 26 through parasitic collector resistance $R_c$. Voltage node V4 is the point between bipolar transistor Q1 and resistance $R_c$. CCS 40 also contains a resistor $R_{ed}$ connected between voltage pad 22 and a second bipolar transistor Qd. Bipolar transistor Qd is connected to ground 26 through parasitic collector resistance $R_{cd}$. Voltage node V6 is the point between bipolar transistor Qd and resistance $R_{cd}$. The base of bipolar transistor Qd is connected to the drain 30 of nMOS transistor M2 at voltage node V3 and the base of bipolar transistor Q1 is connected to the emitter of bipolar transistor Qd at voltage node V5.

When bipolar transistors Q1 and Qd operate in the active region, they have a power dissipation that is mainly determined by the emitter area (WeXLe) and the width of the collector-base depletion region ($W_{BC\_dep}$). Therefore, for design purposes power density can, in principle, be reduced quadratically just by simultaneously changing the emitter width (We) and the emitter length (Le). Thus, by operating bipolar transistors Q1 and Qd in the forward active mode, circuit 10 should be able to handle higher stress currents than other nMOS protection devices for the same silicon area. For a given stress power level, the power density in a bipolar transistor operated in the forward active mode is reduced by a factor r approximately given by $$r = \frac{W_{D\,dep} \cdot X_j}{L_e \cdot X_{BC\,dep}}$$

Here, it is assumed that the emitter width is equal to the nMOS device width for simplicity. Assuming that $X_j$ is of the order of $X_{BC\_dep}$, for a typical value of $W_{D\_dep}=0.1$ μm one gets $$r \approx 0.1/L_e$$

For a value of $L_e=5$ μm, the power density in a bipolar device would be only 1/50 the power density found in the reference nMOS protection device. Therefore, for a given stress current, one should expect to see a much lower peak temperature in a protection structure comprised of pnp bipolar devices working in active region than in traditional protection structures relying solely on nMOS transistors.

Figure 3A:
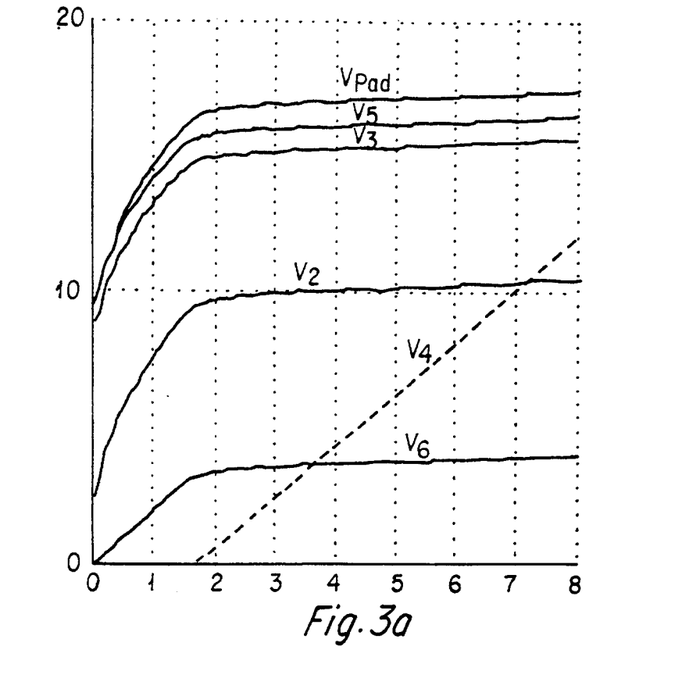
FIGS. 3a–b are graphs of a SPICE simulation of the circuit of FIG. 2.
Figure 3B:
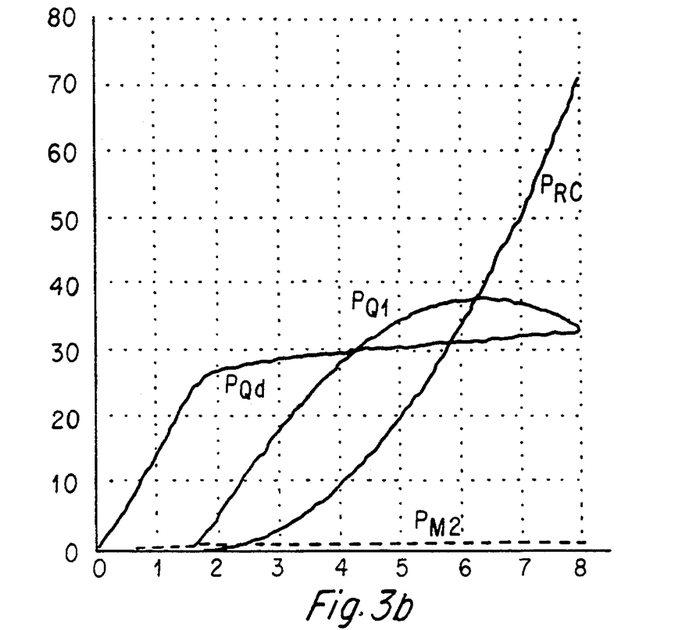

If the forward gain of the vertical pnp transistors of a given n-well CMOS process is low (~10-20) or the designer wants to remove stress load from the driver transistor M2, CCS 40 can be implemented with a pair of pnp devices Q1 and Qd connected as Darlington pair as shown in FIG. 2. In the circuit of FIG. 2, nMOS transistors M1 and M2 are the trigger and switch driver devices as described above. CCS 40 is made of a tandem connection of vertical bipolar pnp devices Q1 and Qd. The pnp bipolar transistor Qd, the first stage in CCS 40, will enter active region when the voltage drop across resistor $R_1$ reaches approximately 0.6[V]. The pnp bipolar transistor Q1, the second stage in the CCS, will begin conducting stress current when the stress current level is such that a certain voltage drop across the emitter resistance $R_{ed}$ is reached. The desired voltage drop will vary by design, but could typically be on the order of 0.6[V]. The cascade effect can be seen from the SPICE simulation results shown in FIG. 3a–b for circuit 10. Since it is desirable to minimize the power dissipation in both the trigger nMOS transistor M1 and the driver nMOS transistor M2, resistors $R_1$ and $R_e$ are on the order of 1 [k] in the preferred embodiment. This allows transistor Qd to be driven into active region with a low level of stress current (approximately 2.5 [mA]). In FIG. 3a, this is reflected by the slope exhibited by node voltage $V_6$. In this design, resistor $R_{ed}$ was set to 0.5 [Ω] approximately. Resistor $R_{ed}$ determines the stress current level that forces bipolar transistor Q1 into conduction. In the example depicted in FIG. 3b, the entry point of Q1 is ~1.5[A]. As shown in FIG. 3b, the power dissipation levels predicted for each of the circuit elements by the SPICE simulations indicate that indeed the stress load imposed on the driver nMOS transistor M2 is negligible compared to the load sustained by CCS 40.

Figure 4:
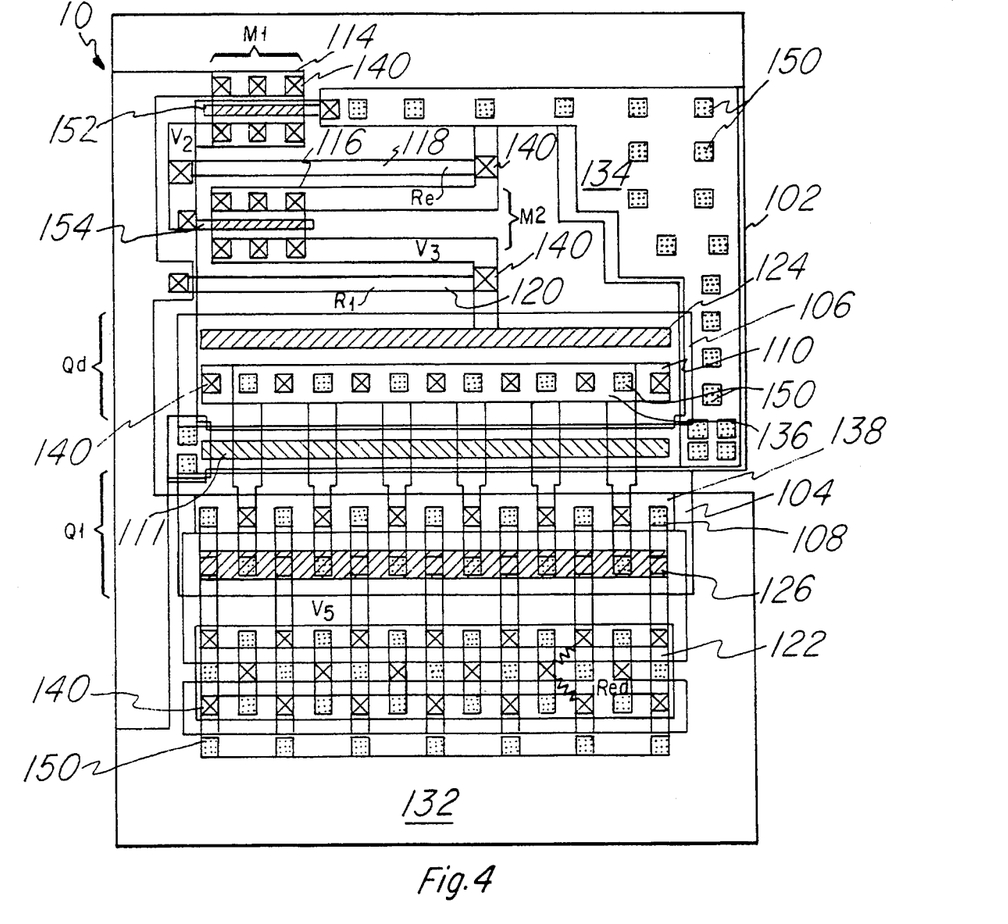
FIG. 4 is a layout diagram of the circuit of FIG. 2.

The formation of circuit 10 will now be described in conjunction with a n-well CMOS process. FIG. 4 shows a preferred layout for the circuit 10 of FIG. 2. N-well regions 104 and 106 are formed in substrate 102. N-well region 104 will function as the base region of bipolar transistor Q1 and n-well region 106 will function as the base region of bipolar transistor Qd. Next, p+ diffusion regions 108 and 110 are formed in n-wells 104 and 106 respectively. P+ diffusion region 108 forms the emitter of bipolar transistor Q1 and p+ diffusion region 110 forms the emitter region of bipolar transistor Qd. P+ diffusion region 111 may be formed in substrate 102 simultaneously with p+ regions 108 and 110. P+ region 111 will form a substrate (collector) contact for transistors Q1 and Qd. Next, gates 152 and 154 are formed by conventional techniques. N+ diffusion regions 114, 116, 118, 120, 122, 124, and 126 are formed next. N+ diffusion regions 114 and 116 are formed in substrate 102 for nMOS transistors M1 and M2, respectively. N+ regions 118, 120, and 122 are also formed in substrate 102 and comprise resistors $R_e$, $R_1$ and $R_{ed}$, respectively. N+ regions 124 and 126 are formed in n-wells 104 and 106, respectively to form contacts to n-wells 104 and 106. Next, metal1 is deposited, patterned and etched to form pad interconnect 132, ground 134, voltage node interconnects V2, V3, and V5, and emitter electrodes 136, and 138. Contacts 140 are formed next to make any desired connections between the diffusion regions (108, 110, 111, 114, 116, 118, 120, 122, 124, and 126) and metal1. Metal2 is then deposited patterned and etched, as shown in FIG. 4. Finally, contacts 150 are formed to make any desired connections between metal1 and metal2. Both metal1 and metal2 are used as shown in FIG. 4 to assure uniform current distribution to bipolar transistors Q1 and Qd. It should be noted that the value of resistor $R_{ed}$ may be very small. In order to accomplish this, parallel resistors $R_{ed}$ are formed with duplicate contacts.

Figure 5:
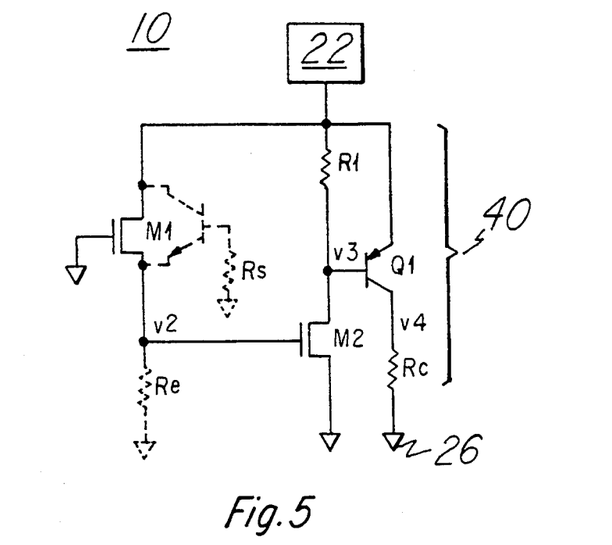
FIG. 5 is a schematic diagram of an alternative first preferred embodiment of the invention.
Figure 6A:
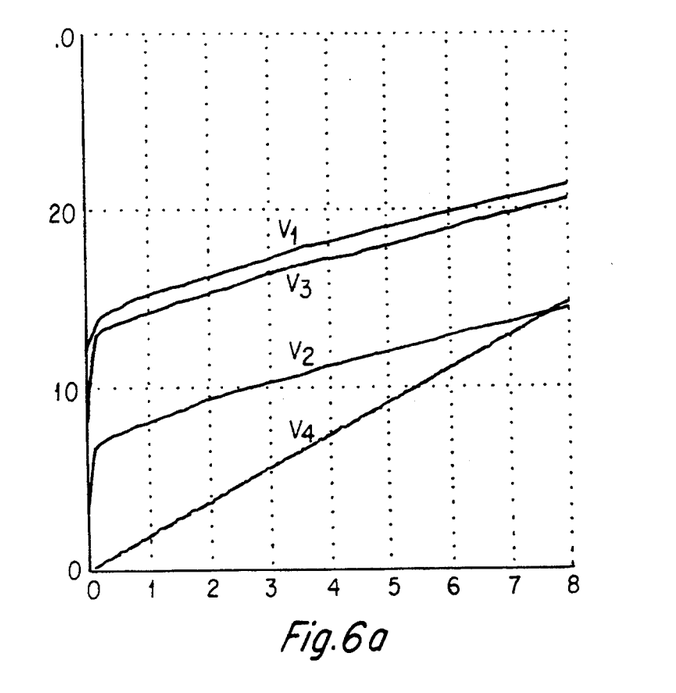
FIGS. 6a–b are graphs of a SPICE simulation of the circuit of FIG. 5.
Figure 6B:
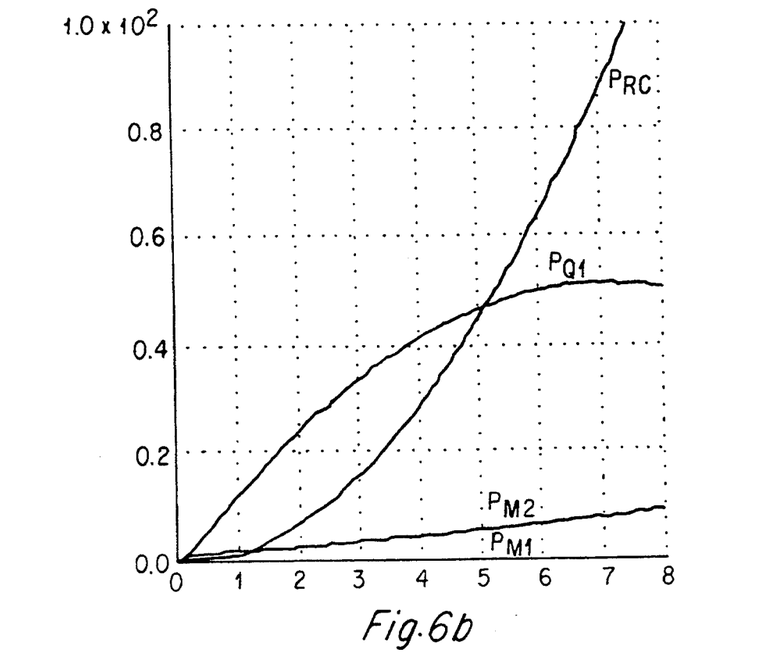

FIG. 5 shows an alternative first preferred embodiment of the invention. CCS 40 comprises a bipolar transistor Q1 connected between voltage pad 22 and ground 26. Bipolar transistor Q1 has a base connected to the drain 30 of nMOS transistor M2 at voltage node V3. $R_c$ represents the parasitic collector resistance of bipolar transistor Q1 at voltage node V4. Resistor $R_1$ is connected between voltage pad 22 and drain 30. In operation, pnp transistor Q1 will begin conducting stress current once the current drawn by the nMOS transistor M2 is high enough to produce a voltage drop of about 0.6 [V] across the resistor $R_1$. It will be apparent to those skilled in the art that the voltage drop for Q1 to begin conducting stress current will vary depending on design. While Q1 is conducting, the drain current on M2 would be the sum of the current flowing in $R_1$ and the base current of Q1. Resistor $R_c$ should be minimized by layout to prevent Q1 from going into saturation. FIG. 6a presents the SPICE simulated node voltages vs. stress current level for circuit 10. FIG. 6a shows that under these conditions, Q1 operates in forward active region away from saturation. FIG. 6b, shows the power dissipation levels vs. stress current for the various elements in the protection circuit 10 shown in FIG. 5. The power dissipation in the nMOS trigger device M1 is negligible compared to power dissipation on M2, Q1 and $R_c$. Although for low level stress events, protection is achieved by the nMOS device M2 operating in saturation, soon as the stress current level increases, most of the stress power dissipation is diverted to CCS 40 and its parasitic collector resistance $R_c$.

Figure 7:
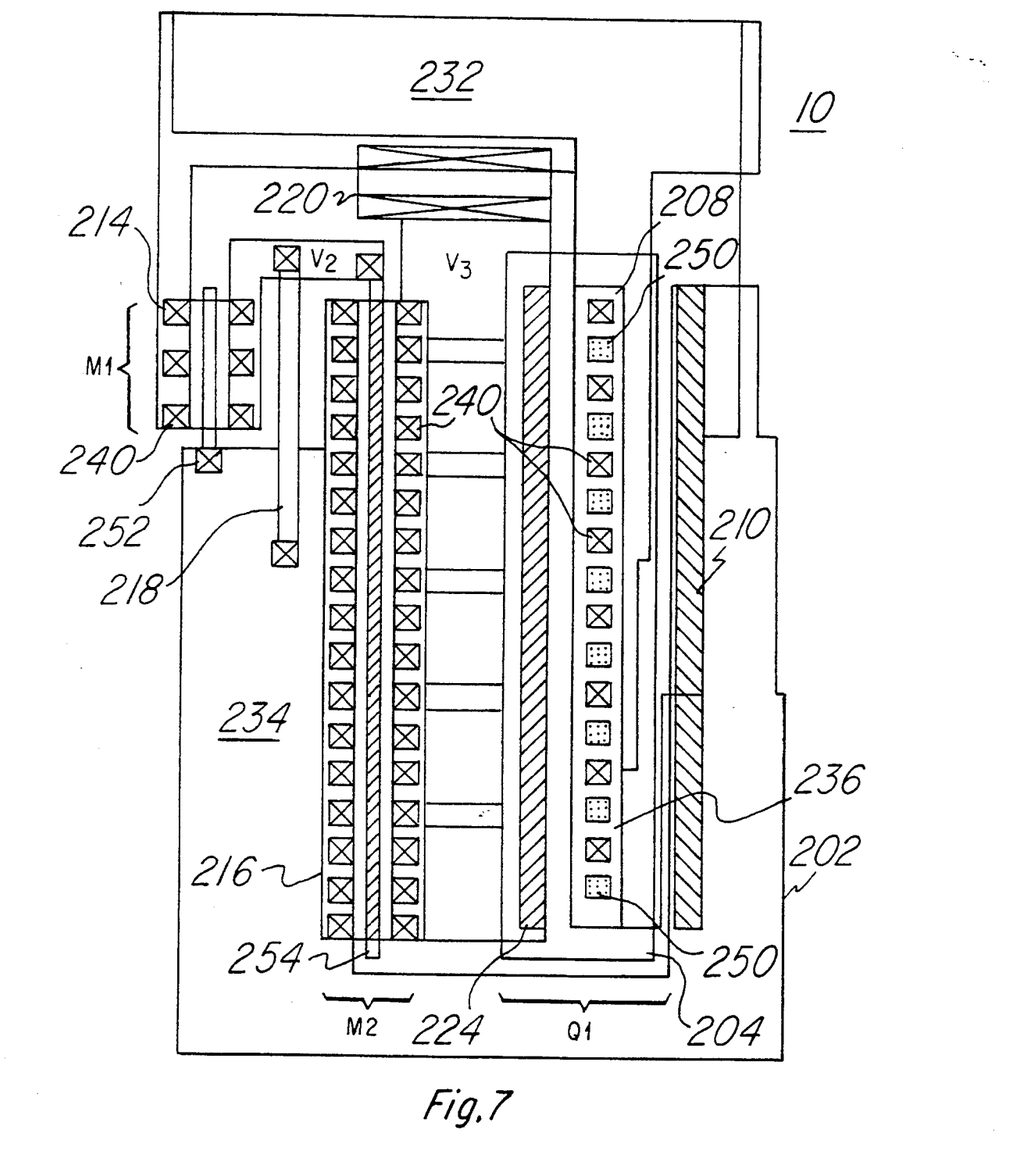
FIG. 7 is a layout diagram of the circuit of FIG. 5.

The preferred method of forming alternative circuit 10 will now be described in conjunction with a n-well CMOS process. Other methods will be apparent to those skilled in the art. FIG. 7 shows the preferred layout of the circuit 10 of FIG. 5. N-well region 204 is formed in substrate 202. N-well region 204 will function as the base region of bipolar transistor Q1. Next, p+ diffusion region 208 is formed in n-well 204. P+ diffusion region 208 forms the emitter of bipolar transistor Q1. P+ diffusion region 210 may be formed in substrate 202 simultaneously with p+ region 208. P+ region 210 will form substrate (collector) contact for transistor Q1. Next, gates 252 and 254 are formed by conventional techniques. N+ diffusion regions 214, 216, 218, 220, and 224 are formed next. N+ diffusion regions 214 and 216 are formed in substrate 202 for nMOS transistors M1 and M2, respectively. N+ regions 218 and 220 are also formed in substrate 202 and comprise resistors Re and R1, respectively. N+ region 224 is formed in n-well 204 to form contact to n-well 204. Next, metal1 is deposited, patterned and etched to form pad interconnect 232, ground 234, voltage node interconnects V2 and V3, and emitter electrode 236. Contacts 240 are formed next to make any desired connections between the diffusion regions (208, 210, 214, 216, 218, 220, and 224) and metal1. Metal2 is then deposited patterned and etched, as shown in FIG. 7. Finally, contacts 250 are formed to make any desired connections between metal1 and metal2.

A comparison between FIGS. 3a and 6a reveals that for high stress levels, the CCS behavior is more ideal for the circuit in FIG. 2 than for the circuit in FIG. 5. This is the result of the improved current sinking capability characteristic of the tandem connection of the pnp bipolar transistors.

Figure 8:
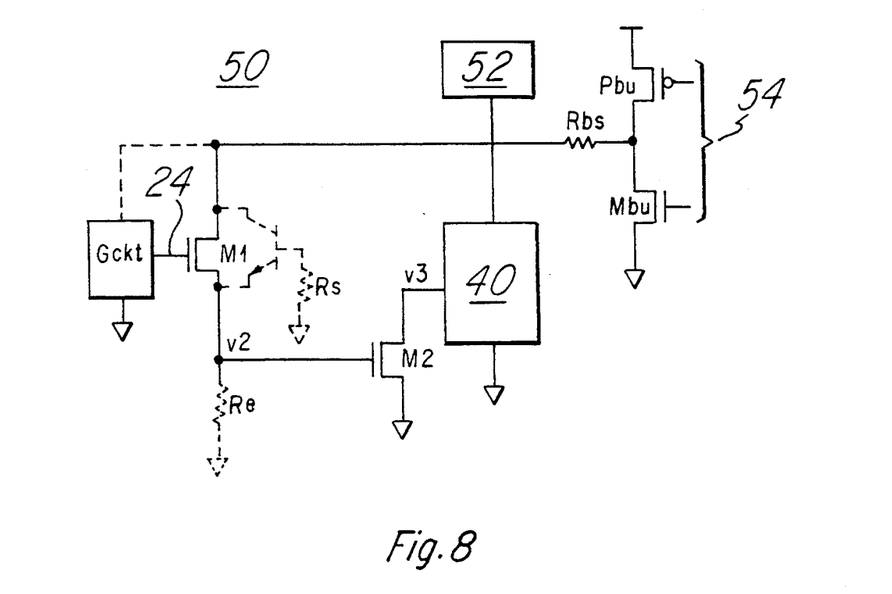
FIG. 8 is a schematic diagram of a second preferred embodiment of the invention.

FIG. 8 shows an output ESD/EOS protection circuit 50 according to a second preferred embodiment of the invention applied to an output pin 52. NMOS transistor M2, resistor $R_e$, and CCS 40 are connected as described above. Devices Mbu and Pbu represent the pull-down and pull-up transistors, respectively, of output buffer 54. In order to attain optimum ESD/EOS protection in output pin 52, it is important to assure that indeed the protection network will carry most of the current under stress conditions. This imposes two additional design constraints. The first of these constraints deals with the fact that the trigger and sustaining voltage of the protection circuit 50 should be less than the breakdown and snapback voltages of the nMOS pull-down transistor Mbu. For the second constraint, a serial resistor Rbs is placed between the output buffer 54 and the protected pin 52 in order to assure that the protection circuit 50 has a lower dynamic resistance than the output pull-down device Mbu under stress conditions.

In order to implement the first constraint, two steps need to be taken. First, to reduce the trigger voltage of M1, the gate 24 is not directly tied to ground allowing transient coupling under fast rising stress conditions. The gate 24 of M1 can be grounded through device Gckt. Gckt can either be an n-well resistor or a field oxide device whose gate is connected to Vpad. Second, to reduce the sustaining voltage of the protection circuit 50 compared to the snapback voltage of Mbu, M1 should be designed with minimum channel length ($L_{min}$) and the channel length of Mbu should be set to $L_{bu}=\alpha \cdot L_{min}$ where $1.2 \leq \alpha \leq 2.0$.

Transistors M1, M2, CCS 40, and resistor $R_e$ are formed as described above. Additional elements Gckt, Rbs, Pbu, and Mbu are formed by conventional methods.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A protection circuit for protecting a device from ESD and EOS comprising:
   a. a trigger device connected between a voltage pad and a first resistor;
   b. a pnp-based current controlled switch connected between said voltage pad and a ground; and
   c. a switch driver device connected between said pnp-based current controlled switch and ground and having a first gate connected to said trigger device.

2. The protection circuit of claim 1, wherein said trigger device and said switch driver device comprise nMOS transistors.

3. The protection circuit of claim 1, wherein:
   a. said first gate is connected to a source of said trigger device;
   b. said first resistor is connected between said source and said ground; and
   c. said trigger device comprises a second gate connected to said ground.

4. The protection circuit of claim 1, wherein said first resistor comprises an n+ diffusion region.

5. The protection circuit of claim 1 wherein said voltage pad is an input pad.

6. The protection circuit of claim 1 wherein said voltage pad is a power supply pad.

7. The protection circuit of claim 1, further comprising first and second metal levels connected such that said protection circuit is operable to uniformly distribute a stress current to and within said pnp-based current-controlled switch.

8. The protection circuit of claim 1, wherein said pnp-based current controlled switch comprises:
   a. a first bipolar transistor connected between said voltage pad and said ground and having a base connected to said switch driver device, said first bipolar transistor comprising a collector resistance (parasitic) connected to ground; and
   b. a second resistor connected between said voltage pad and said switch driver device.

9. The protection circuit of claim 8, wherein said first bipolar transistor comprises a substrate collector and a p+ diffusion emitter region located within said base, wherein said base comprises a n-well region.

10. The protection circuit of claim 8, wherein said second resistor comprises an n+ diffusion region.

11. The protection circuit of claim 1, wherein said pnp-based current controlled switch comprises:
   a. a first bipolar transistor connected between said voltage pad and said ground, said first bipolar transistor comprising a first collector resistance (parasitic) connected to ground;
   b. a second resistor connected between said voltage pad and a first base of said first bipolar transistor;
   c. a second bipolar transistor connected between said second resistor and said ground and having a second base connected to said switch driver device, said second bipolar transistor comprising a second collector resistance (parasitic) connected to ground; and
   d. a third resistor connected between said voltage pad and said switch driver device.

12. The protection circuit of claim 11, wherein:
   a. said first bipolar transistor comprises a substrate collector, and a first p+ diffusion emitter region located within said first base;
   b. said second bipolar transistor comprises said substrate collector, and a second p+ diffusion emitter region located within said second base;
   c. said first and second bases comprise first and second n-wells, respectively; and
   d. said second and third resistors comprise n+ diffusion regions.

13. The protection circuit of claim 1, further comprising:
   a. a ground circuit connected to a second gate of said trigger device; and
   b. a fourth resistor located between said voltage pad and said device to be protected, wherein said voltage pad is an output pad.

14. The protection circuit of claim 13, wherein said ground circuit comprises a n-well resistor connected between said second gate and said ground.

15. The protection circuit of claim 13, wherein said ground circuit comprises a field oxide device connected between said second gate and said ground and having a third gate connected to said voltage pad.

16. The protection circuit of claim 13, wherein said fourth resistor comprises an n+ diffusion region.

17. An ESD/EOS protection circuit for protecting a device comprising:
   a. a first nMOS transistor having a first gate connected to a ground, a first drain connected to a voltage pad and a first source;
   b. a second nMOS transistor having a second gate connected to said first source, a second drain, and a second source connected to said ground;
   c. a first resistor connected between said first source and said ground; and
   d. a pnp-based current controlled switch connected between said voltage pad and said ground and also connected to said second drain.

18. The protection circuit of claim 17, wherein said pnp-based current controlled switch comprises:
   a. a first bipolar transistor connected between said voltage pad and said ground and having a base connected to said second drain, said first bipolar transistor comprising a collector resistance (parasitic) connected to ground; and
   b. a second resistor connected between said voltage pad and said second drain.

19. The protection circuit of claim 17, wherein said pnp-based current controlled switch comprises:
   a. a first bipolar transistor connected between said voltage pad and said ground, said first bipolar transistor comprising a first collector resistance (parasitic) connected to ground;
   b. a second resistor connected between said voltage pad and a base of said first bipolar transistor;
   c. a second bipolar transistor connected between said second resistor and said ground and having a base connected to said second drain, said second bipolar transistor comprising a second collector resistance (parasitic) connected to ground; and
   d. a third resistor connected between said voltage pad and said second drain.

20. The protection circuit of claim 17, further comprising:
   a. a ground circuit connected between said first gate and ground; and
   b. a second resistor connected between said voltage pad and said circuit, wherein said voltage pad is an output pad.

21. A method of forming an ESD/EOS protection circuit for protecting a device having a substrate, comprising the steps off
   a. forming a first well region of a first conductivity type in said substrate to form a first base region of a first bipolar transistor;
   b. forming a first diffusion region of a second conductivity type in said first well region to form a first emitter of said first bipolar transistor;
   c. forming a second diffusion region of said second conductivity type in said substrate to form a substrate contact;
   d. forming a first MOS transistor having a first drain, first gate, and a first source;
   e. forming a second MOS transistor having a second drain, a second gate and a second source;
   f. forming a third diffusion region of said first conductivity type in said substrate to form a first resistor;
   g. forming a fourth diffusion region of said first conductivity type in said substrate to form said second resistor;
   h. connecting said first drain to a voltage pad;
   i. grounding said second source;
   j. connecting said second gate to said first source;
   k. connecting said first resistor between said first source and a ground;
   l. connecting said second resistor between said voltage pad and said second drain; and
   m. connecting said first emitter to said voltage pad.

22. The method of claim 21, further comprising the step of connecting said first base to said second drain.

23. The method of claim 21, further comprising the steps of:
   a. forming a second well region of said first conductivity type in said substrate to form a second base region of a second bipolar transistor; to form a second base region of a second bipolar transistor;
   b. forming a sixth diffusion region of a second conductivity type in said second well region to form a second emitter of said second bipolar transistor;
   c. forming a seventh diffusion region of said first conductivity type to form a third resistor;
   d. connecting said third resistor between said voltage pad and said second emitter;
   e. connecting said first base region to said second emitter region; and
   f. connecting said second base region to said second drain.

24. The method of claim 21, wherein said connecting steps comprise depositing and etching and contacting first and second metal layers such that a stress current is uniformly distributed to said first and second bipolar transistors.

25. The method of claim 21, wherein said step of grounding said first gate comprises forming a field oxide device having a third gate connected to said voltage pad, a drain connected to said first gate, and a source connected to said ground.

26. The method of claim 21, wherein said step of grounding said first gate comprises forming a resistor connected between said first gate and said ground.

27. The method of claim 21, further comprising the step of forming a fourth resistor connected between said voltage pad and said device.

* * * * *